United States Patent
Schofield

(10) Patent No.: US 6,563,447 B1
(45) Date of Patent: May 13, 2003

(54) NON-LINEAR BULK CAPACITANCE BOOTSTRAPPED CURRENT SWITCH

(75) Inventor: William G. J. Schofield, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/041,984

(22) Filed: Jan. 10, 2002

(51) Int. Cl.[7] .................................................. H03M 1/66
(52) U.S. Cl. ........................ 341/136; 341/144; 341/153
(58) Field of Search ................................. 341/133, 136, 341/144, 153

(56) References Cited

U.S. PATENT DOCUMENTS 4,725,813 A * 2/1988 Miyada ...................... 341/136

* cited by examiner

Primary Examiner—Howard L. Williams
(74) Attorney, Agent, or Firm—Iandiorio & Teska

(57) ABSTRACT

A non-linear bulk capacitance bootstrapped current switch includes a current switch circuit including a source node and a first bulk connection having a first bulk capacitance associated with it; a current defining circuit connected to the source node and having a second bulk connection having a second bulk capacitance associated with it; and a tracking circuit for driving the voltage on at least one of the first and second bulk connections in response to the voltage on the source node to reduce the associated non-linear bulk capacitance.

18 Claims, 7 Drawing Sheets

NON-LINEAR BULK CAPACITANCE BOOTSTRAPPED CURRENT SWITCH

FIELD OF THE INVENTION

This invention relates to a non-linear bulk capacitance bootstrapped current switch.

BACKGROUND OF THE INVENTION

In NMOS and PMOS FETs there are inherently parasitic non-linear capacitances between the bulk and the drain and the source (bulk capacitances). The source to bulk parasitic capacitance has been typically reduced or eliminated either by shorting the bulk to the source or connecting the bulk to an external voltage source higher than the source voltage to reverse bias the capacitance. In conventional current output DAC's, FET's are used to construct each cell including a differential current switch and a current source for driving the switch. Thus the common source node of the current switch is subject to the source to bulk capacitance of the current switch and the drain to bulk capacitance of the current source. A differential current switch will exhibit distortion on its output as a result of the non-linear bulk capacitances associated with the common source node. These non-linear bulk capacitances can be a result of just the current switch or can also include any device connected to the common source node. Connecting the bulk to the source of the current switch is not wholly effective because while it reduces the source to bulk capacitance, the drain to bulk capacitance of the current switch is now connected to the common source node. And the bulk to drain capacitance of the current source is still present. Connecting the bulk of the current switch to a fixed voltage greater than the source voltage reduces the non-linearity of the bulk capacitances but the capacitance is still present and still causes frequency roll-off because the capacitance is not fully shorted since the fixed voltage does not precisely follow the source voltage.

BRIEF SUMMARY OF THE INVENTION

It is therefore an object of this invention to provide an improved non-linear bulk capacitance bootstrapped current switch.

It is a further object of this invention to provide such an improved non-linear bulk capacitance bootstrapped current switch with improved distortion performance.

It is a further object of this invention to provide such an improved non-linear bulk capacitance bootstrapped current switch which reduces effective capacitance on the common source node.

It is a further object of this invention to provide such an improved non-linear bulk capacitance bootstrapped current switch which effectively shorts the non-linear component of the capacitances on the common source node.

It is a further object of this invention to provide such an improved non-linear bulk capacitance bootstrapped current switch in which the bulk and source voltage track.

This invention results from the realization that by connecting the bulk connections of one or both of the current switching circuit and current defining circuit to a tracking circuit so that the voltage on the bulk capacitance follows that on the source node of the current switch those non-linear bulk capacitances see no signal voltage over them so the normal roll-off effect of their capacitance as well as their non-linearity is removed.

This invention features a non-linear bulk capacitance bootstrapped current switch including a current switching circuit including a source node and a first bulk connection having a first bulk capacitance associated with it. A current defining circuit is connected to the source node and has a second bulk connection with a second bulk capacitance associated with it. A tracking circuit drives the voltage on at least one of the first and second bulk connections in response to the voltage on the source node to reduce the associated non-linear bulk capacitance. In a preferred embodiment the current switching circuit may include an FET. The current switching circuit may include a differential current switch which includes FETs and the source node may be a common source node. The FETs may be PMOS or NMOS. The first bulk capacitance may be a source to bulk capacitance. The current defining circuit may include a current source; it may include a current sink. The tracking circuit may be connected to both bulk connections. The tracking circuit may include a DC level shifting circuit. The current defining circuit may include a cascode circuit. The second bulk capacitance may be the bulk to drain capacitance of the cascode circuit. The first bulk capacitance may be the source to bulk capacitance and the second bulk capacitance may be the drain to bulk capacitance. The tracking circuit may drive the voltage on at least one of the bulk connections to be equal to the voltage on the source node or to be greater than the voltage on the source node or less than the voltage on the source node depending in part on whether the current defining circuit is a current source or current sink.

BRIEF DESCRIPTION OF THE DRAWINGS

Other objects, features and advantages will occur to those skilled in the art from the following description of a preferred embodiment and the accompanying drawings, in which.

PREFERRED EMBODIMENT

Figure 1:
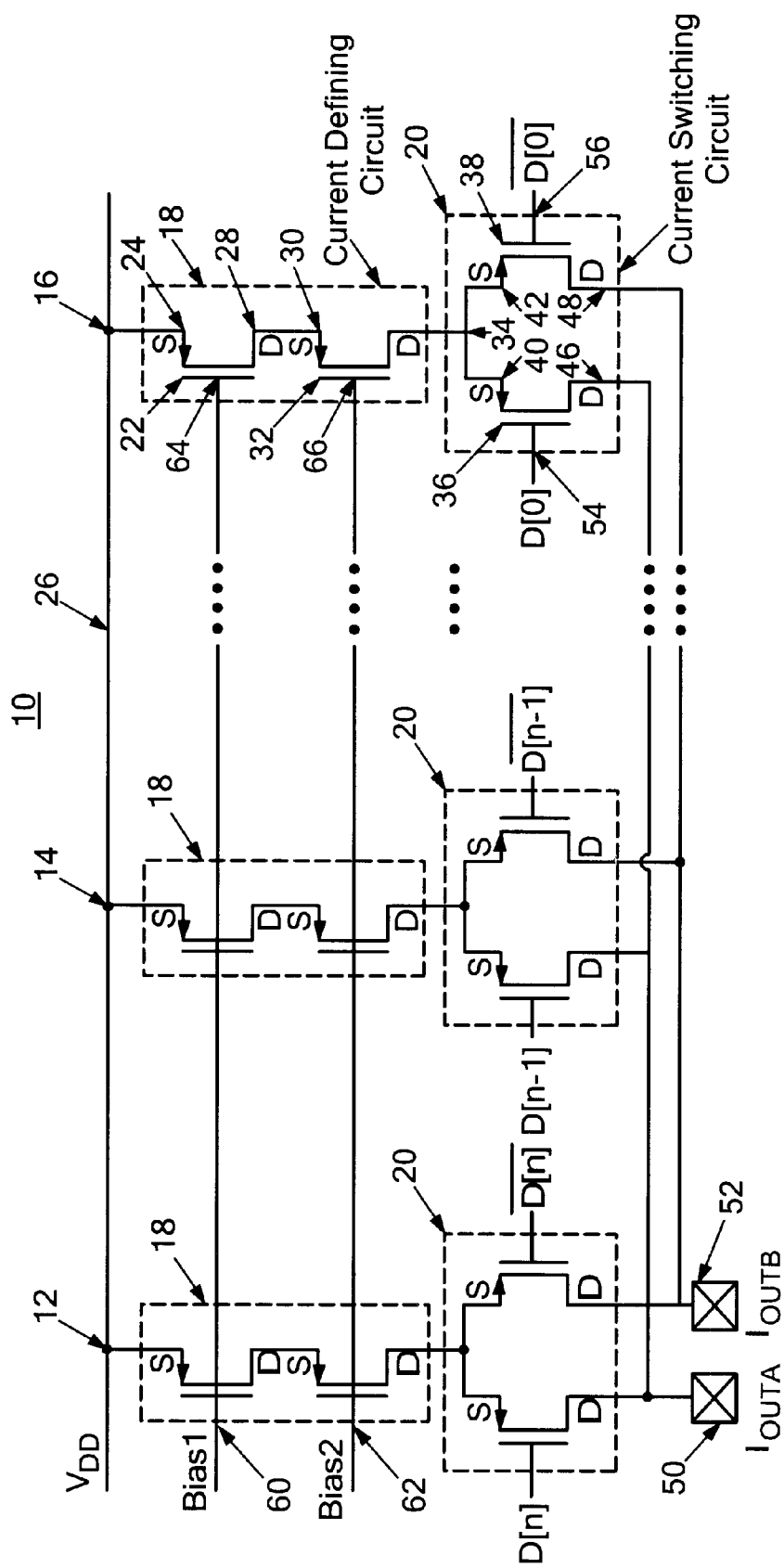
FIG. 1 is a schematic diagram illustrating a conventional DAC.

There is shown in FIG. 1 a portion of a conventional digital to analog converter (DAC) 10 including a number of current switching cells only a few of which, the most significant bit cell 12, next most significant bit cell 14, and least significant bit cell 16 are shown. Each such cell as exemplified by cell 16, includes a current defining circuit 18 and a current switching circuit 20. Current defining circuit 18 includes current source FET. 22 having its source 24 connected to supply voltage 26, $V_{DD}$, and its drain 28 connected to the source 30 of cascode circuit (FET) 32 whose drain is connected to the common source node 34 of current switching circuit 20 which includes the differential current switch implemented by FETs 36 and 38. The sources 40 and 42 of both FETs 36 and 38 are connected to the common source node 34. Their drains 46 and 48 are connected, respectively, to outputs 50 and 52 which are ganged with the outputs from the drains of each of the other cells. The complementary data inputs to FETs 36 and 38 are delivered on their gates 54 and 56. Both the current source FET 22 and the cascode circuit FET 32 are operated in tandem with all of the other current source FETs and cascode circuit FETs in the other cells by biases on lines 60 and 62 applied to their gates 64 and 66.

Figure 2:
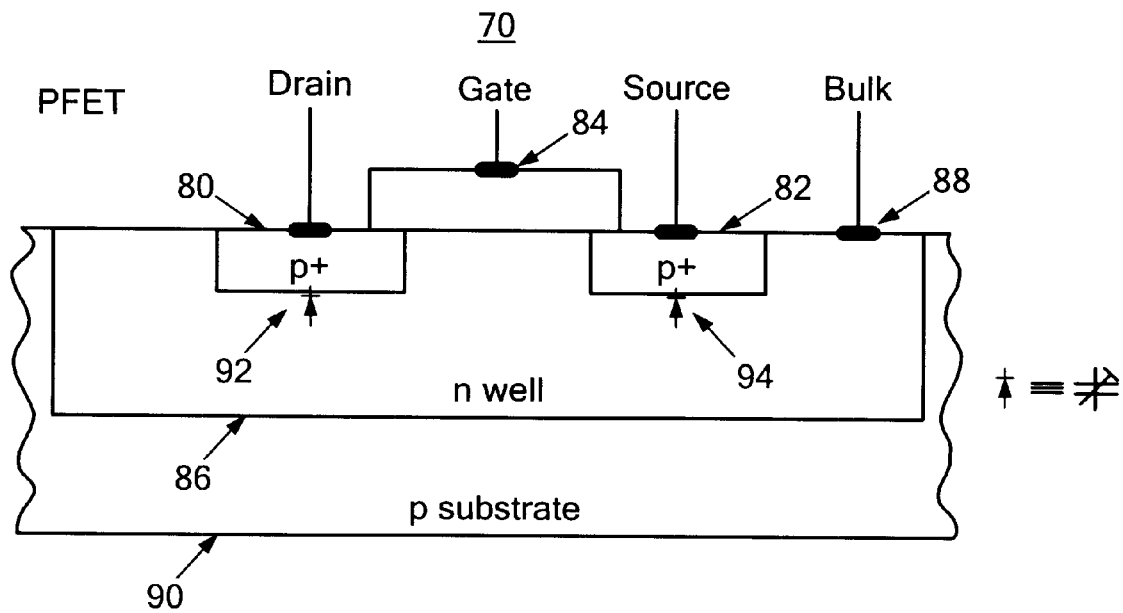
FIG. 2 is a side sectional schematic view of a portion of an FET showing the origin of source and drain non-linear bulk capacitances.

Each FET used in FIG. 1, as exemplified by PFET 70, FIG. 2 includes a P+ doped drain 80 and P+ doped source 82 interconnected by gate 84, all of which are mounted in N-type well 86 which has a bulk connection at 88; well 86 sits in a p-type substrate 90. By PFET and NFET is meant P-type MOSFET or N-type MOSFET. By the nature of the device a parasitic diode exists 92 between drain 80 and well 86 and a parasitic diode 94 exists between source 82 and well 86. These parasitic diodes give rise to the non-linear drain to bulk and source to bulk capacitance, respectively.

Figure 3:
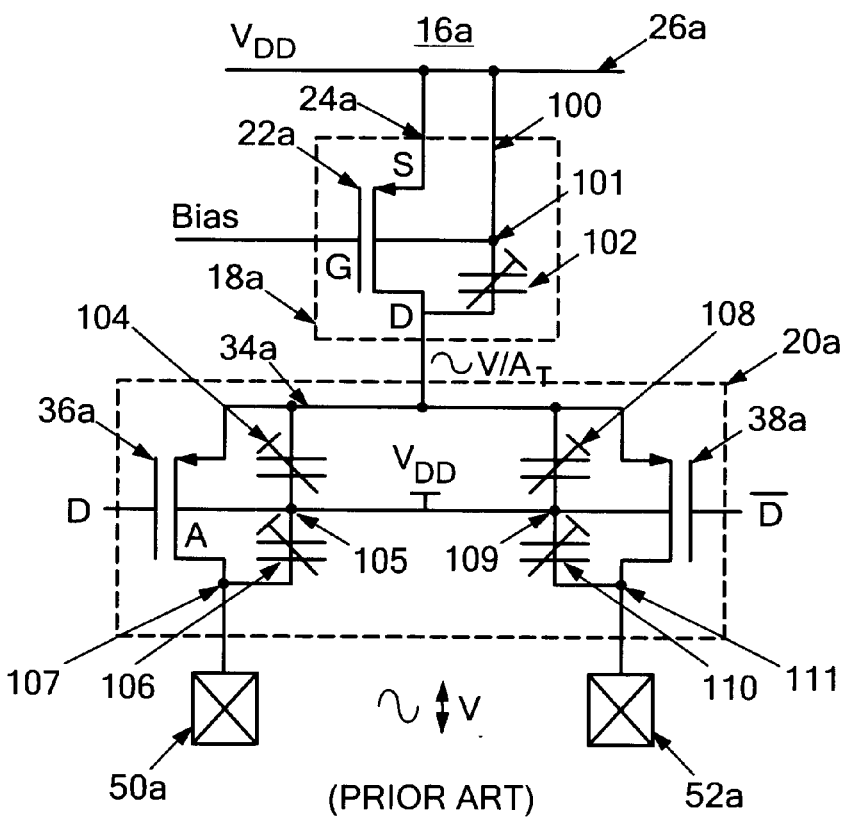
FIG. 3 is a simplified schematic diagram of a prior art current switching cell used in the DAC of FIG. 1.

These non-linear bulk capacitances appear in the prior art current defining circuit 18a and current switching circuit 20a, FIG. 3. In current source 18a the source to bulk capacitance has been eliminated by connecting the bulk connection 100 to the supply voltage 26a $V_{DD}$ at the same point as source 24a. But there is still the non-linear drain to bulk capacitance 102 associated with FET 22a. Here the current defining circuit 18a includes only current source FET 22a. Current switching circuit 20a includes FET 36a which has a non-linear source to bulk capacitance 104 and a non-linear drain to bulk capacitance 106 and FET 38 which has the non-linear source to bulk capacitance 108 and non-linear drain to bulk capacitance 110. Source to bulk capacitance 104 is connected between source node 34a and bulk connection 105. Source to bulk capacitance 108 is connected between source node 34a and bulk connection 109. Drain to bulk capacitance 106 is connected from the drain connection 107 to bulk connection 105 and drain to bulk capacitance 110 is connected from drain connection 110 to bulk connection 109. The bulk connection of the current defining circuit 18a is at 101. Points 105 and 109 are connected to fixed voltage $V_{DD}$. Connecting the source to bulk capacitances 104 and 108 to the source of the current switch is not wholly effective because while it reduces the source to bulk capacitance, the drain to bulk capacitance of the current switch is now connected directly to the common source node and the bulk to drain capacitance 102 of the current source is still present. Connecting the bulk of the current switch to a fixed voltage greater than the source voltage reduces the non-linearity of the bulk capacitance but the capacitance is still present and still causes frequency rolloff because the capacitance is not fully shorted since the fixed voltage does not precisely follow the source voltage.

Figure 4:
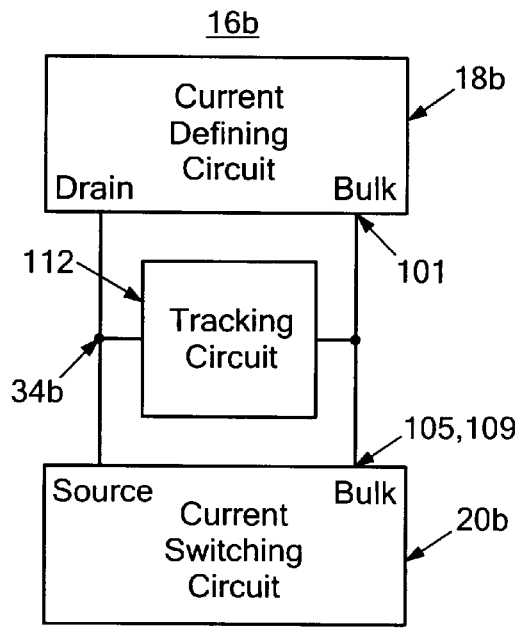
FIG. 4 is a simplified schematic block diagram of a non-linear bulk capacitance bootstrapped current switch according to this invention for use in the DAC of FIG. 1.

In accordance with this invention, each current cell e.g. 16b, FIG. 4 includes current defining circuit 18b and current switching circuit 20b along with a tracking circuit 112. Tracking circuit 112 is connected to the source node 34b which interconnects the drain of current defining circuit 18b and the source of current switching circuit 20b. Tracking circuit 112 drives the bulk connection. Tracking circuit 112 drives the voltage on at least the bulk connections 105 and 109 or bulk connection 101 or both in response to the voltage on the source node 34b, to reduce the associated non-linear bulk capacitance.

Figure 5:
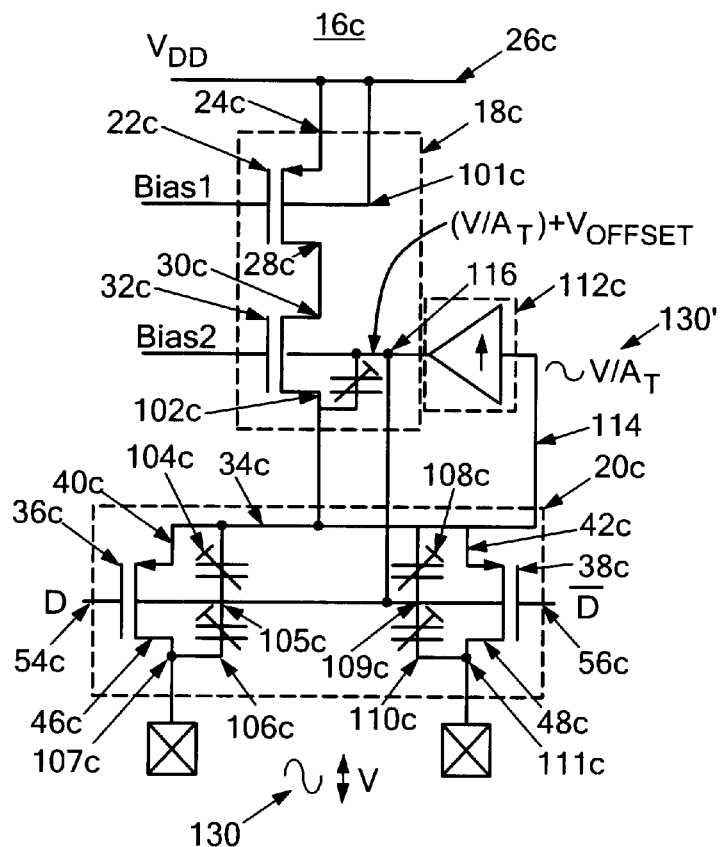
FIG. 5 is a more detailed schematic diagram of the non-linear bulk capacitance bootstrapped current switch of FIG. 4.

This is shown in greater detail in FIG. 5 where current defining circuit 18c once again includes current source FET 22c and cascode circuit FET 32c. There it can be seen that tracking circuit 112c has its input 114 connected to common source node 34c and its output drives the bulk connection 116 of cascode circuit FET 32c and the bulk connections 105c and 109c of FETs 36c and 38c. Thus, tracking circuit 112c drives the voltage on the bulk capacitors 102c, 104c and 108c in response to the voltage sensed at the common source node 34c.

In operation the output signal 130, FIG. 5 is reflected through the FETs 36c and 38c and appears in diminished form as shown at 130' due to the gain of those transistors. Tracking circuit 112c adds the offset onto the diminished form of the output signal V/$A_t$ where V is the output voltage and $A_t$ is the gain of the FET 36c or 38c. Thus, the bulk connections 116, 105c and 109c are not just offset from the source voltage at common source node 34c but follow the movement of signal 130' so that the signal across the bulk capacitances is always zero.

Figure 6:
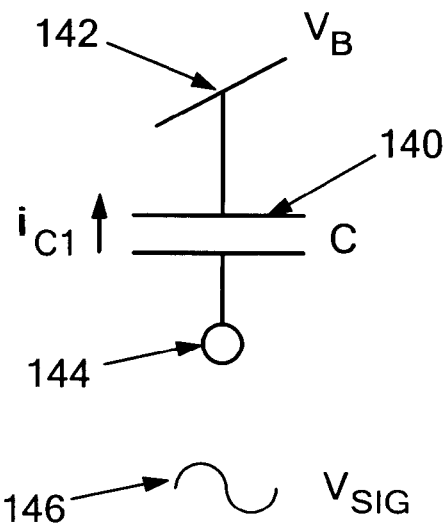
FIG. 6 illustrates the voltage across a bulk capacitance connected to a fixed voltage.
Figure 7:
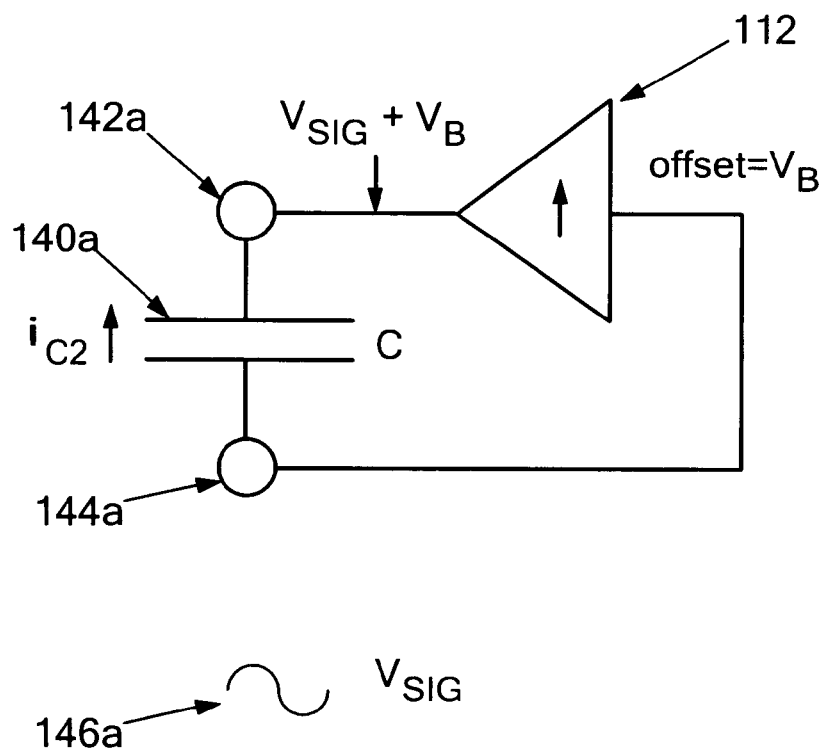
FIG. 7 illustrates the voltage across a bulk capacitance connected to a tracking circuit according to this invention to effect non-linear bulk capacitance bootstrapping.

This can be better understood with references to FIG. 6 and 7. In FIG. 6 a representative non-linear bulk capacitance 140 is shown connected at 142 to a fixed voltage $V_B$ with its other terminal 144 subjected to a signal voltage 146 $V_{sig}$. The current flow in that case follows the equation $$i_{c1} = C * \frac{(V_{sig} - V_b)}{dt} \quad (1)$$

therefore the current is a function of 146 $V_{sig}$ $$i_{c1} = f(V_{sig}). \quad (2)$$

Thus while the bulk connection and source connection will be at approximately the same voltage, thereby reducing the non-linear bulk capacitance, the effect is not complete because the voltage will vary in proportion to the signal 146. The current flowing in the capacitance will vary in proportion with the signal voltage 146 which is reflected back into the circuit from the output. This current that flows back through the non-linear capacitance is the source of the distortion of the output signal which is derived from the current defining circuit.

Figure 8:
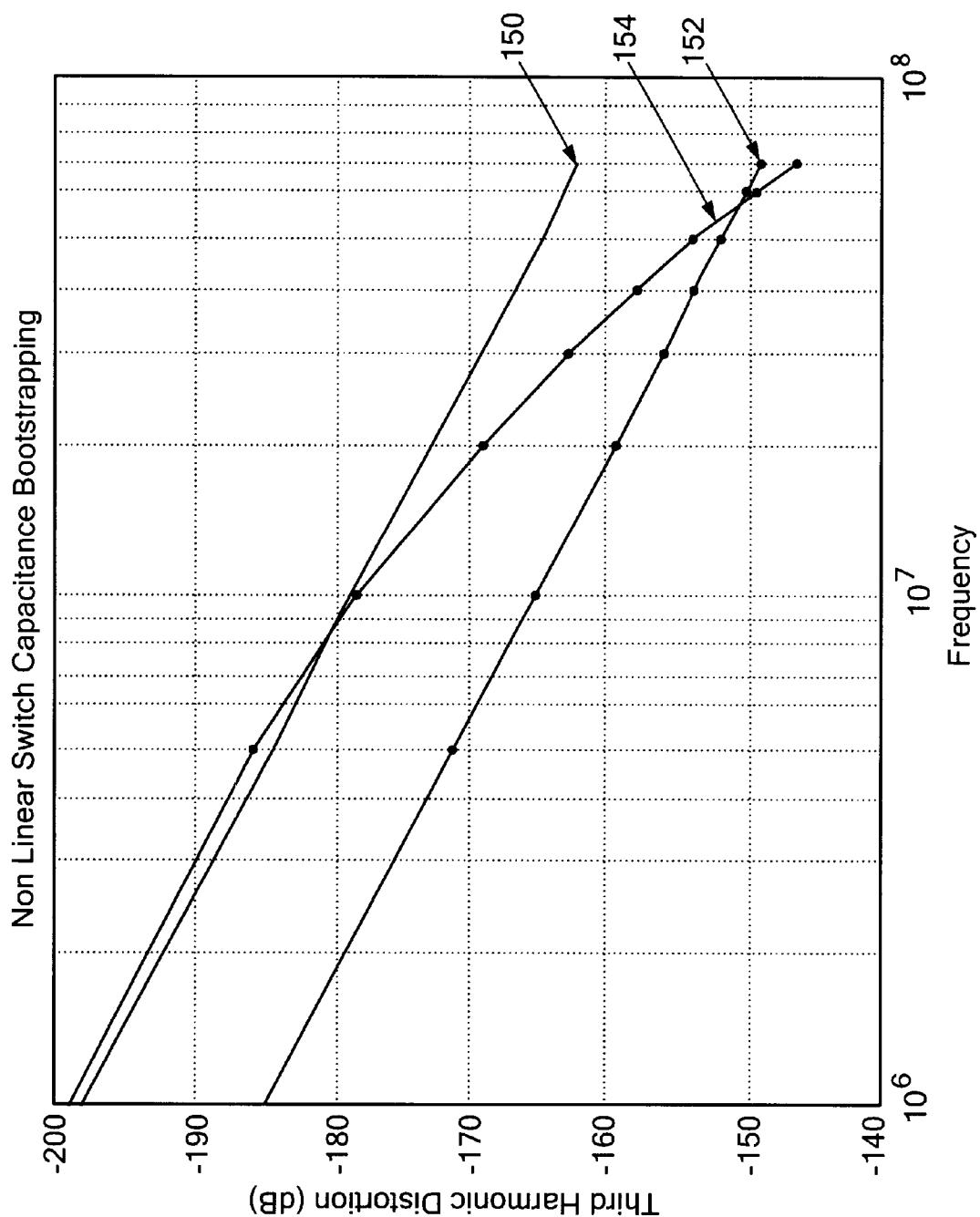
FIG. 8 is a graphic representation of the distortion improvement effected by this invention.

In contrast, in this invention the terminal 144a, FIG. 7, is sensed by the tracking circuit 112 which then drives the point 142a with an offset $V_B$ added on top of the signal $V_{sig}$ 146a. Thus, $i_{c2}$ in capacitor 140a is $$i_{c2} = \frac{C(V_{sig} - (V_{sig} + V_B))}{dt} = -\frac{CV_B}{dt} \quad (3)$$

so that it is apparent that $i_{c2}$ in the case of this invention is not a function of $V_{sig}$. The capacitance 140a not only introduces no distortion as a function of the parasitic non-linear bulk capacitance, but also removes the normal capacitive rolloff from the circuit. The distortion improvement effected by this invention is shown in FIG. 8 with a graphic representation of the harmonic distortion versus frequency in a logarithmic plot. There it can be seen that the characteristic 150 of the bulk capacitance of the switch and cascode driven with an ideal tracking circuit current according to this invention provides a significant improvement in the distortion over the bulk capacitance of the switch and cascode when connected to a fixed voltage as shown at 152. The bulk capacitance of the switch and the cascode when driven with an actual practical tracking circuit is shown at 154.

Figure 9:
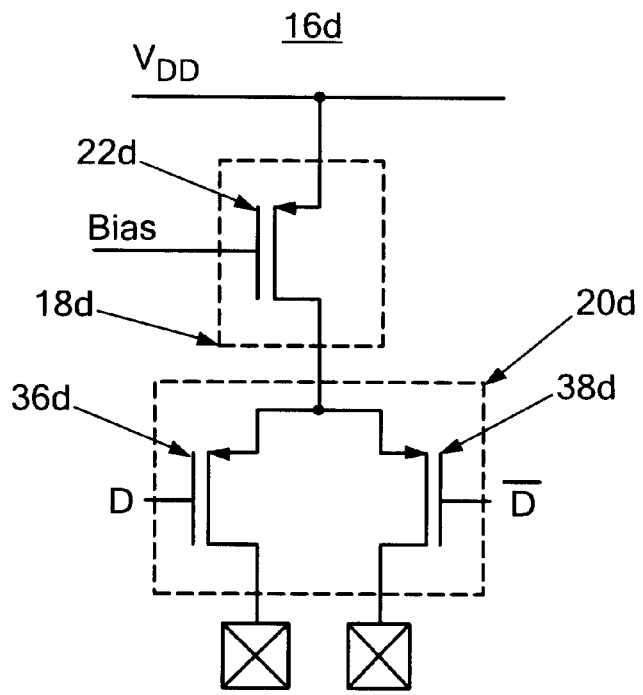
FIG. 9 is a simplified schematic diagram of the differential current switch of FIG. 5 using a simple current source.
Figure 10:
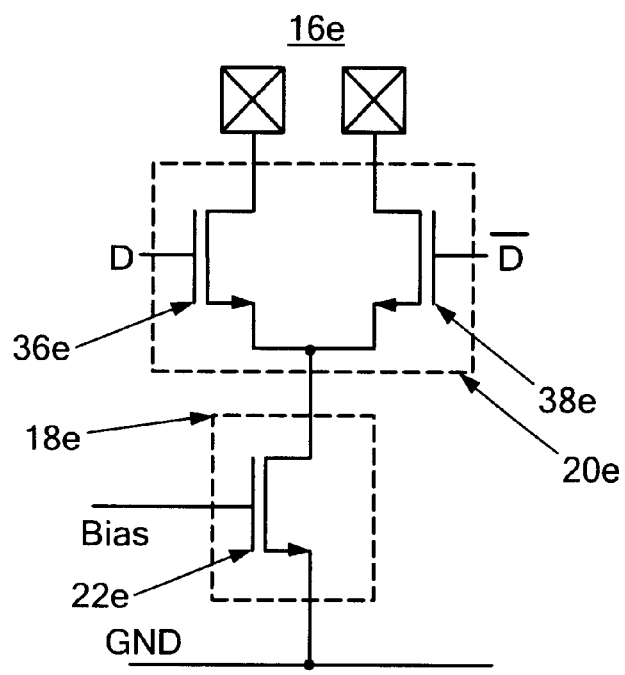
FIG. 10 is a simplified schematic diagram of the differential current switch of FIG. 5 using a simple current sink.
Figure 11:
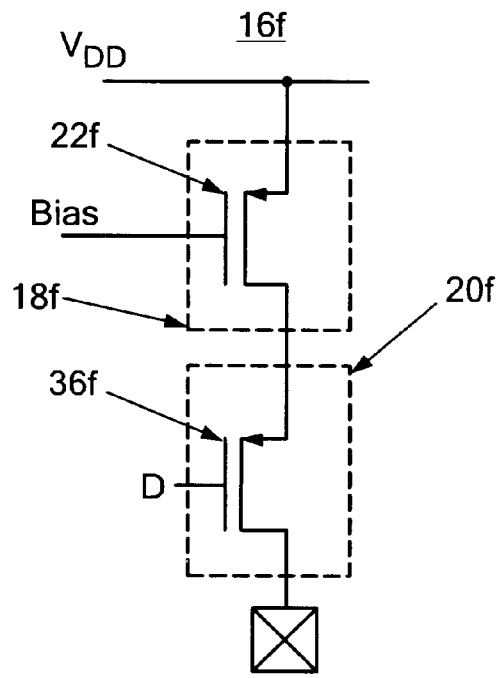
FIG. 11 is a simplified schematic diagram of a single ended current switch with a current source.
Figure 12:
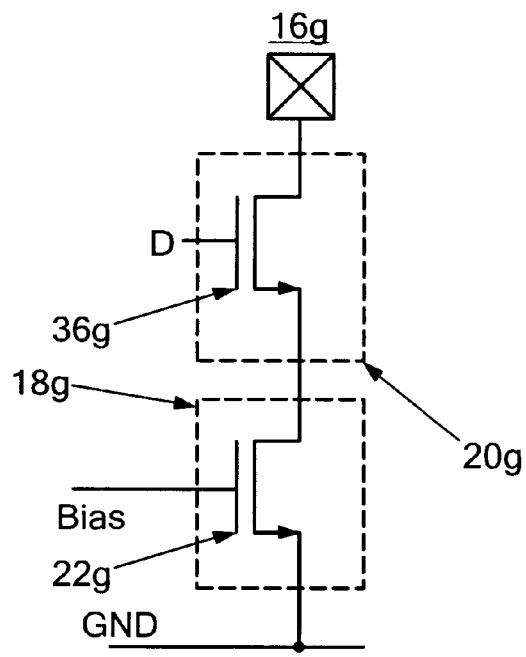
FIG. 12 is a simplified schematic diagram of a single ended current switch with a current sink.

The invention is not limited to the particular embodiments shown thus far as the tracking circuit may include a simple DC level shifting circuit and is applicable to current switching cells 16 regardless of their construction. For example, current switching circuit 20*d*, FIG. 9 may include a differential current switch including PFETs 36*d* and 38*d* driven by a current defining circuit 18*d* which includes simply a current source FET 22*d*. Or, as shown in FIG. 10, current switching circuit 20*e* may include a differential current switch using NFET transistors 36*e* and 38*e* in which case the current defining circuit 18*e* may include a current sink implemented by NFET 22*e*. And the invention is not limited to differential current switches either, for example, as shown in FIG. 11, current source 18f implemented by a PFET transistor 22f drives a current switching circuit 20f which includes a single ended PFET transistor 36f. The circuits of FIG. 11 can be implemented using NFET technology as shown in FIG. 12 where single ended NFET transistor 36*g* implements the current switch 20*g* which is connected with the current defining circuit 18*g* implemented by NFET transistor 22*g*.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims.

What is claimed is:

1. A non-linear bulk capacitance bootstrapped current switch comprising:
   a current switching circuit including a source node and a first bulk connection having a first bulk capacitance associated with it;
   a current defining circuit connected to said source node and having a second bulk connection with a second bulk capacitance associated with it; and
   a tracking circuit connected to both bulk connections for driving the voltage on at least one of said first and second bulk connections in response to the voltage on said source node to reduce the associated non-linear bulk capacitance.

2. The non-linear bulk capacitance bootstrapped current switch of claim 1 in which said current switching circuit includes an FET.

3. The non-linear bulk capacitance bootstrapped current switch of claim 2 in which said FET is a PMOS.

4. The non-linear bulk capacitance bootstrapped current switch of claim 2 in which said FET is a NMOS.

5. The non-linear bulk capacitance bootstrapped current switch of claim 1 in which said current switching circuit includes a differential current switch.

6. The non-linear bulk capacitance bootstrapped current switch of claim 5 in which said differential current switch includes FETs and said source node is a common source node.

7. The non-linear bulk capacitance bootstrapped current switch of claim 6 in which said differential current switch includes FETs and said FETs are PMOS.

8. The non-linear bulk capacitance bootstrapped current switch of claim 6 in which said differential current switch includes FETs and said FETs are NMOS.

9. The non-linear bulk capacitance bootstrapped current switch of claim 1 in which said first bulk capacitance is a source to bulk capacitance.

10. The non-linear bulk capacitance bootstrapped current switch of claim 1 in which said current defining circuit includes a current source.

11. The non-linear bulk capacitance bootstrapped current switch of claim 10 in which said current defining circuit includes a cascode circuit.

12. The non-linear bulk capacitance bootstrapped current switch of claim 11 in which said second bulk capacitance is a bulk to drain capacitance of said cascode circuit.

13. The non-linear bulk capacitance bootstrapped current switch of claim 1 in which said current defining circuit includes a current sink.

14. The non-linear bulk capacitance bootstrapped current switch of claim 1 in which said tracking circuit includes a DC level shifting circuit.

15. The non-linear bulk capacitance bootstrapped current switch of claim 1 in which said first bulk capacitance is the source to bulk capacitance and said second bulk capacitance is the drain to bulk capacitance.

16. The non-linear bulk capacitance bootstrapped current switch of claim 1 in which said tracking circuit drives the voltage on the at least one of said bulk connections to be equal to the voltage on said source node.

17. The non-linear bulk capacitance bootstrapped current switch of claim 1 in which said tracking circuit drives the voltage on the at least one of said bulk connections to be greater than the voltage on said source node.

18. The non-linear bulk capacitance bootstrapped current switch of claim 1 in which said tracking circuit drives the voltage on the at least one of said bulk connections to be less than the voltage on said source node.

* * * * *